(12) United States Patent
Walsh

(10) Patent No.: US 7,414,487 B2
(45) Date of Patent: Aug. 19, 2008

(54) APPARATUS FOR PROVIDING AN OSCILLATING SIGNAL TO A LOAD

(75) Inventor: Gregory Simon Walsh, Middlesex (GB)

(73) Assignee: QUALCOMM Incorporated, San Diego, CA (US)

( * ) Notice: Subject to any disclaimer, the term of this patent is extended or adjusted under 35 U.S.C. 154(b) by 111 days.

(21) Appl. No.: 10/558,569

(22) PCT Filed: May 28, 2004

(86) PCT No.: PCT/GB2004/002274

§ 371 (c)(1),
(2), (4) Date: Jul. 18, 2006

(87) PCT Pub. No.: WO2004/107581

PCT Pub. Date: Dec. 9, 2004

(65) Prior Publication Data

US 2006/0273861 A1    Dec. 7, 2006

(30) Foreign Application Priority Data

May 30, 2003    (GB) ................................ 0312445.0

(51) Int. Cl.
*H03B 1/00* (2006.01)
(52) U.S. Cl. ........................ 331/74; 331/185; 455/260; 375/376
(58) Field of Classification Search ............... 331/74, 331/185; 455/260; 375/376
See application file for complete search history.

(56) References Cited

U.S. PATENT DOCUMENTS

| | | | |
|---|---|---|---|
| 5,926,071 A * | 7/1999 | Kukkonen | 331/109 |
| 6,337,600 B1 | 1/2002 | Shigemori et al. | 331/16 |
| 6,778,032 B2 * | 8/2004 | Imaoka | 331/185 |
| 2002/0132596 A1 | 9/2002 | Kim | |

FOREIGN PATENT DOCUMENTS

| | | |
|---|---|---|
| EP | 0998088 | 5/2000 |
| WO | WO00/04633 | 1/2000 |
| WO | WO00/19607 A1 | 4/2000 |

* cited by examiner

*Primary Examiner*—Arnold Kinkead
(74) *Attorney, Agent, or Firm*—Kyong Macek; William Marcus Hooks; Thomas R. Rouse

(57) ABSTRACT

An apparatus for providing an oscillating signal to a load comprises: a phase locked loop, PLL, comprising a feedback loop; a power control means for manipulating oscillating signal power; an isolator for isolating the feedback loop from the load; and a mode selector coupled to the power control means and the isolator, for controlling the power control means and the isolator so that in a steady state power mode, oscillation power is supplied to the load and in a reduced power mode, power is isolated by the isolator from the load to the feedback loop so that phase lock is maintained when the oscillation power is reduced.

17 Claims, 4 Drawing Sheets

APPARATUS FOR PROVIDING AN OSCILLATING SIGNAL TO A LOAD

FIELD OF THE INVENTION

This invention relates to an apparatus for providing an oscillating signal to a load. More specifically, the invention relates to an apparatus for providing an oscillating signal to a load during which the apparatus is operable in a steady state mode and a reduced power mode.

BACKGROUND TO THE INVENTION

Mobile communication transceivers, for example a mobile telephone, generally comprise a single frequency-synthesizer which serves as a local oscillator for both the transmit and receive sides of the transceiver. Such frequency-synthesizers typically comprise one or more phase-locked loops (PLLs) that can be programmed to lock onto a specific frequency.

In a dual standard phone, for example one that is capable of working in both a WCDMA environment (Wideband Code Division Multiple Access) and a GSM environment (Global Standard for Mobile communication), it is likely that two separate radio frequency (RF) sections will be required. Following conventional design procedures, each RF section would incorporate a respective frequency synthesizer and the two RF sections would be required to operate in close proximity to each other.

The frequency synthesizer of one RF section will be a possible source of RF interference to the other RF section, and likewise the other RF section will be a possible source of interference to the one section. One method to alleviate this contribution of mutual interference is to turn off each PLL when it is not in use. Unfortunately, returning the synthesizer to its steady state mode of operation takes time and there is therefore a delay between turning the synthesizer back on and being able to work. This time delay may be detrimental to the operation of the dual standard phone.

In a dual standard phone it is not unusual to have to pause operation in one standard (e.g. WCDMA) while measurements are made of the system in the other standard (e.g. GSM). If this pause in operation is too long the interruption can become perceptible to the user. Plainly this is undesirable because the quality of service is degraded. Indeed, if the pause is too long, the phone may find itself disconnected from the original service. Under these circumstances, the economic value of a multiple standard phone is severely reduced.

Additionally, power consumption in mobile communication transceivers is a continuing concern for designers and developers. Reductions in power consumption directly contribute to the usefulness of mobile phones.

The invention was made with the above discussed problems in mind and aims to address the related problems.

SUMMARY OF THE INVENTION

According to one aspect of the invention there is provided an apparatus for providing an oscillating signal to a load, the apparatus comprising: a phase locked loop, PLL, comprising a feedback loop; a power control means for manipulating oscillating signal power; an isolator for isolating the feedback loop from the load; and a mode selector coupled to the power control means and the isolator, for controlling the power control means and the isolator so that in a steady state power mode, oscillation power is supplied to the load and in a reduced power mode, power is isolated by the isolator from the load to the feedback loop so that phase lock is maintained when the oscillation power is reduced.

According to another aspect of the invention there is provided a circuit for providing an oscillating signal to a load, the circuit comprising: a PLL comprising a feedback loop; a power control means for controlling oscillation power; an isolation means for isolating oscillation power to the feedback loop from the load; and a means for controlling the power control means and the isolation means to provide a steady state power mode in which power is supplied to the load and a reduced power mode, in which oscillation power is reduced and the isolation means isolates the feedback from the load.

The invention also provides a method of operating a phase locked loop, PLL, to supply an oscillating signal to a load, the PLL comprising: a feedback loop; a VCO, having an output; a power control means disposed within the VCO; an isolator coupled to the output of the VCO; a mode selector coupled to the isolator and the power control means; an attenuator coupled to the load; and a phase detector coupled to the attenuator and the isolator and the feedback loop, the method comprising: controlling the power control means so that output power from the VCO is reduced, and controlling the isolator so that output power is isolated from the load to the phase detector so that phase lock is maintained.

The above and further features of the invention are set forth with particularity in the appended claims and together with advantages thereof will become clearer from consideration of the following detailed description of an embodiment of the invention given with reference to the accompanying drawings.

DETAILED DESCRIPTION OF THE PREFERRED EMBODIMENTS

Figure 1:
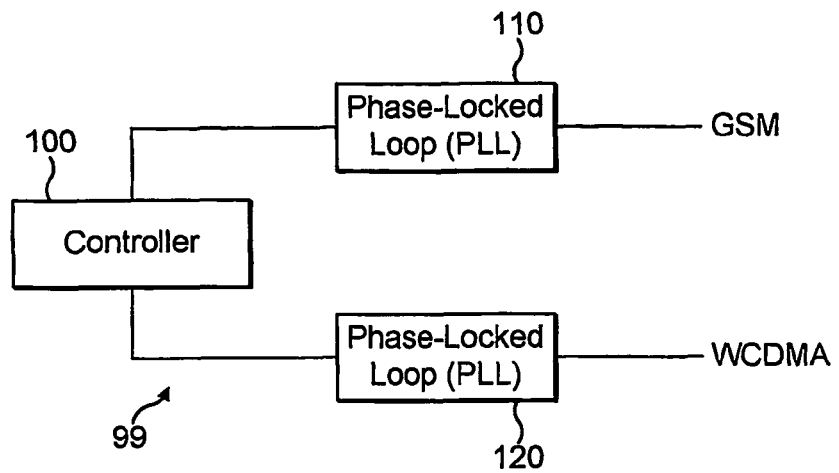
FIG. 1 is a block diagram of part of a radio frequency section of a dual standard phone with two phase-locked loops.

Turning now to FIG. 1 of the accompanying drawings, there is shown a portion of radio frequency (RF) section 99 of a dual standard phone. For the sake of example the dual standard phone is assumed to be capable of operation in the GSM environment (Global Standard for Mobile communication) and in the WCDMA environment (Wideband Code Division Multiple Access). It will of course be appreciated that the following apparatus and method can be applied equally well to other standards and environments and are therefore not limited to GSM and/or WCDMA.

Controller 100 controls a first phase-locked loop (PLL) 110 and second PLL 120. The first PLL 110 provides oscillation power for the GSM environment and the second PLL 120 provides oscillation power for the WCDMA environment. It is desirable to be able to turn off the first PLL 110 while the second PLL 120 is operating, and to turn off the second PLL 120 while the first PLL 110 is operating. This is because turning the PLLs off advantageously reduces RF interference between the two operating environments and reduces power consumption for the phone. However, bringing a PLL back up from a complete turn off, or shut down, takes time.

Figure 2:
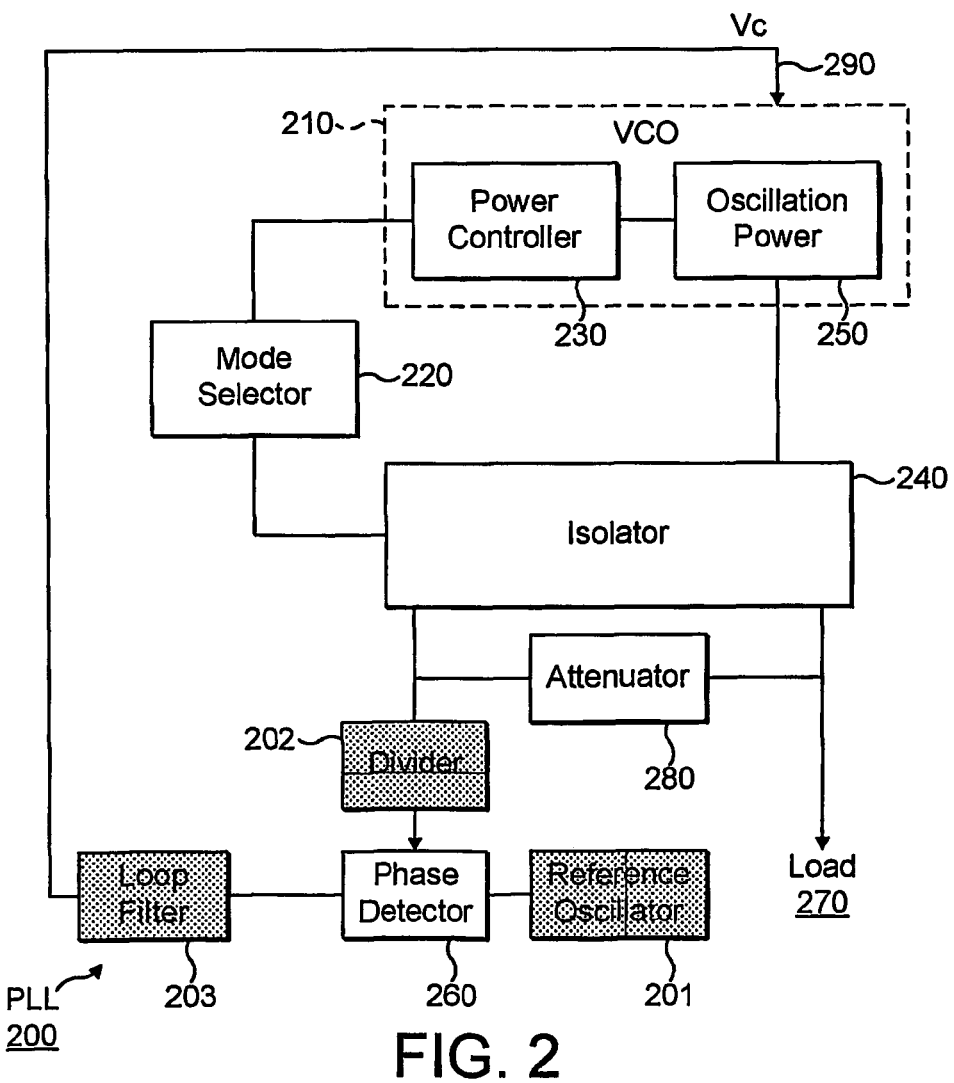
FIG. 2 is a block diagram showing a phase-locked loop operable in a first power mode or steady state mode and a second reduced power mode.

Turning to FIG. 2 of the accompanying drawings, there is shown the PLL 200 which is operable in a steady state power mode and in a reduced power mode. In the reduced power mode the PLL 200 is not turned off completely but continues to maintain a phase lock which enables the PLL 200 to be brought back up quickly to full power.

To this end, the PLL 200 comprises a feedback loop. The PLL 200 also comprises a voltage controlled oscillator (VCO) 210 which provides oscillation power for the operation of the PLL 200, and a mode selector 220, which is coupled to a power controller 230 and an isolator 240. The power controller 230 operates to control oscillation power 250 output from the PLL and represented here by a separate block. The isolator 240 is arranged to isolate the oscillation power 250 supplied to the phase detector 260 when the PLL is operating in the reduced power mode.

In the steady state mode, the mode selector 220 controls the power controller 230 such that full oscillation power 250 is provided to load 270. An attenuator 280 divides out a portion of the signal (represented by the oscillation power block 250) and provides that portion to the phase detector 260 so that phase lock is maintained.

In the reduced power mode it is assumed that the load 270 has been removed due to phone operational needs. The mode selector 220 controls the power controller 230 to reduce the oscillation power of the signal output from the PLL 200 (represented by the block 250). In coordination with the reduction in oscillation power, the mode selector 220 controls the isolator 240 so that reduced oscillation power 250 is supplied to phase detector 260 sufficient to maintain phase lock.

Alternatively, the load 270 can be reduced as compared to being removed. The isolator 240 may be a variable attenuator. The mode selector 220 controls the isolator 240 to vary the attenuation between the load 270 and the phase detector 260. In this case in the reduced power mode, the oscillation power 250 is reduced to a level sufficient to maintain phase lock while also supplying sufficient power as required for proper phone operation to the reduced load 270. This reduction in the oscillation power leads to a reduction in RF interference between the two operating environments and a reduction in the power consumed by the phone. Moreover, the PLL can be left at reduced power longer. And, since the PLL can be powered up quickly, the time at reduced power can also be extended.

Although not required for the detailed description of this implementation of the PLL 200, in practice PLL 200 would also comprise other components such as a reference oscillator 201, a loop filter 202 and a divider 203. These components are shown in FIG. 2 in shaded blocks. The reference oscillator 201 feeds a reference signal to the phase detector 260. The divider 202 is connected before phase detector 260 in the path between oscillation power 250 and phase detector 260. The divider ratio of the divider 202 becomes the multiplier for the reference oscillator 201. The loop filter would be between the phase detector 260 output and the VCO 210. Vc 290 is the feedback control for the VCO 210.

Figure 3A:
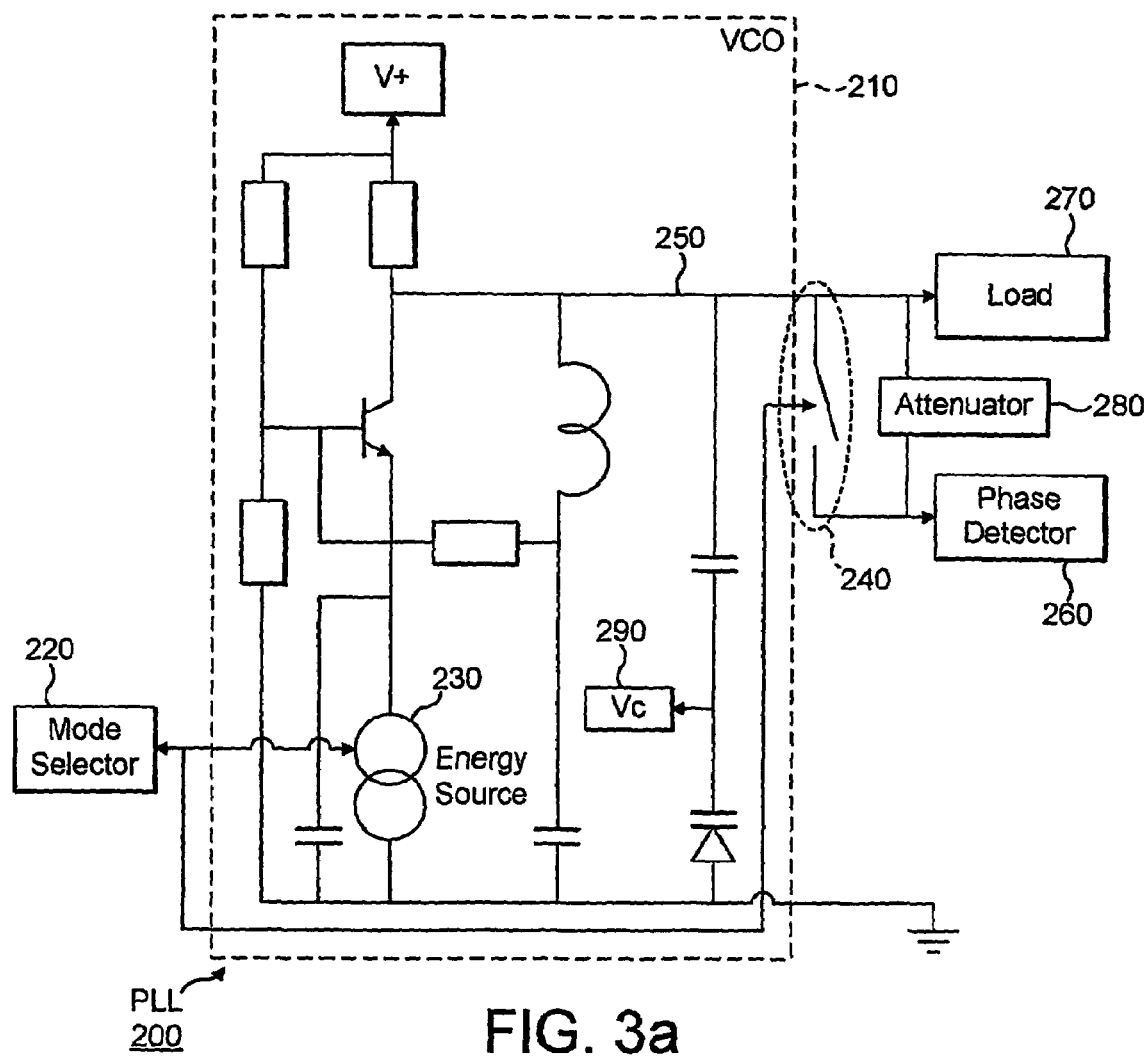
FIG. 3*a* is a schematic diagram of one possible implementation of the phase locked loop of FIG. 2.

A more detailed implementation of the PLL is shown in FIG. 3a of the accompanying drawings. As shown in FIG. 3a, the power controller 230 is represented as an energy source 230a The mode selector 220 is coupled to the energy source 230a and to the isolator 240 in a similar manner to that previously described with reference to FIG. 2 of the drawings. The energy source 230a is contained within the VCO 210. The isolator 240 is also connected to the oscillation power 250 of the VCO 210. In the steady state mode the mode selector 220 controls the energy source 230a such that high oscillation power 250 is provided by the VCO 210 to the load 270. The attenuator 280 divides out a portion of the oscillation power 250 supplied to the load and provides that portion to the phase detector 260 in order to maintain phase lock.

In the reduced power mode it is assumed that the load 270 has been removed due to phone operational needs. The mode selector 220 controls the energy source 230a such that oscillation power from VCO 210 is reduced. At the same time the mode selector 220 controls the isolator 240 to isolate the reduced oscillation power 250 from the load to the phase detector 260. Control voltage Vc 290 supplys feedback from the phase detector 260 to the VCO 210 in order to maintain phase lock.

Figure 3B:
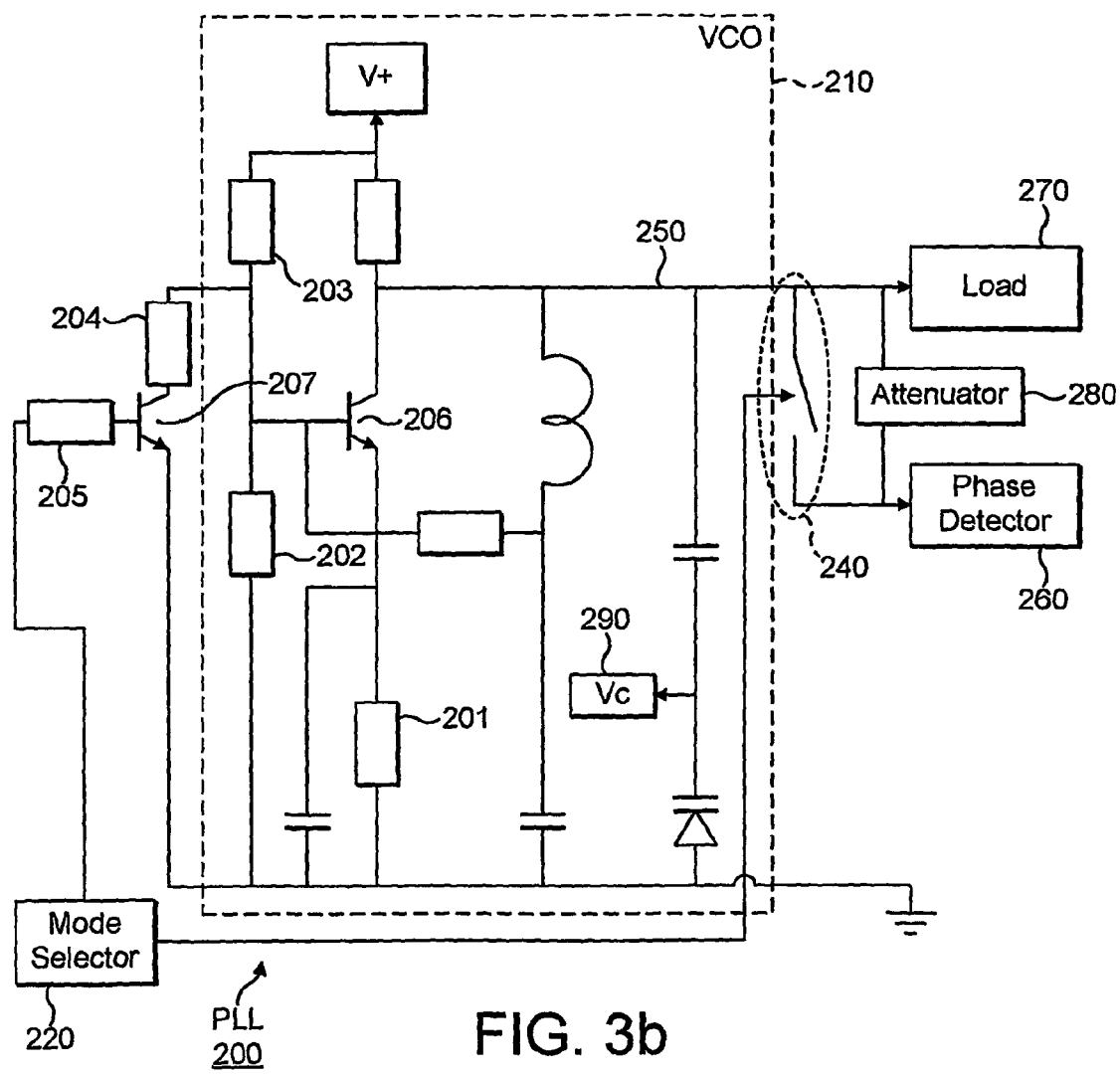
FIG. 3*b* is a schematic diagram of another possible implementation of the phase locked loop of FIG. 2; and, FIG. 4 is a timing diagram of one possible implementation of two phase locked loops of used in the radio frequency section of FIG. 1.

An alternative to using the energy source 230a to manipulate the oscillation power 250 is shown in FIG. 3b of the accompanying drawings. Transistor 207, resistor 204 and resistor 205, cooperate to form a switchable voltage source that works in conjunction with the VCO 210 to reduce the oscillation power 250.

For the steady state mode, the switchable voltage source is selected to OFF by the mode selector 220. When selected to OFF, the switchable voltage source does not interact with the operation of the VCO 210. This allows the VCO 210 to operate such that high power is provided to the load 270. The attenuator 280 divides out a portion of the power supplied by the VCO 210 and provides that power to the phase detector 260. The power supplied to the phase detector 260 is sufficient to maintain phase lock in the PLL.

For the reduced power mode, the switchable voltage source is selected to ON by the mode selector 220 by coupling the resistor 205 to ground. This biases the transistor 207 so that current passes through the resistor 204. The result is a reduction in the current at the collector of transistor 206. This reduction in the current at the collector of transistor 206 (with a corresponding reduction in DC voltage bias) reduces the power output from the VCO. At the same time, the mode selector 220 causes the isolator 240 to isolate the phase detector from the power output from the VCO 210.

There will be occasions when a dual standard phone must switch between operating using the different standards. For this to happen efficiently the phone must stay updated with operational information for both of the systems in which the phone is operable even though the portion of the phone that communicates with one of the systems is in standby.

For example, a dual standard phone is using a first standard to communicate data and voice over a first system. Data and voice communication with a second system is not desirable at this time. However, there is a possibility that the user will move into a region where continued data and voice communication will need to be conducted over the second system due to for example coverage limitations relating to the first system. A transition from using the first system to the second system will appear seamless to the user, if the second system can be rapidly acquired by the phone so as to begin data and voice communication with the second system.

To do this, the dual standard phone needs to have fresh operational information pertaining to the second system. In order to have fresh operational information for the second system the dual standard phone needs to regularly establish control communication with the second system. The dual standard phone therefore needs to allow time for control communication with the second system while the phone is communicating data and voice over the first system. One technique to do this is to provide transmission gaps in the transmission of data and voice using compression techniques.

A transmission gap needs to be small or the user might experience interrupted service. The time required to power up and stabilize a PLL consumes a significant portion of a gap. Therefore it will be appreciated that the above described PLL 200 (which powers up and stabilizes quickly because it maintains lock in the low power mode) is well suited for use in a dual standard phone.

Figure 4:
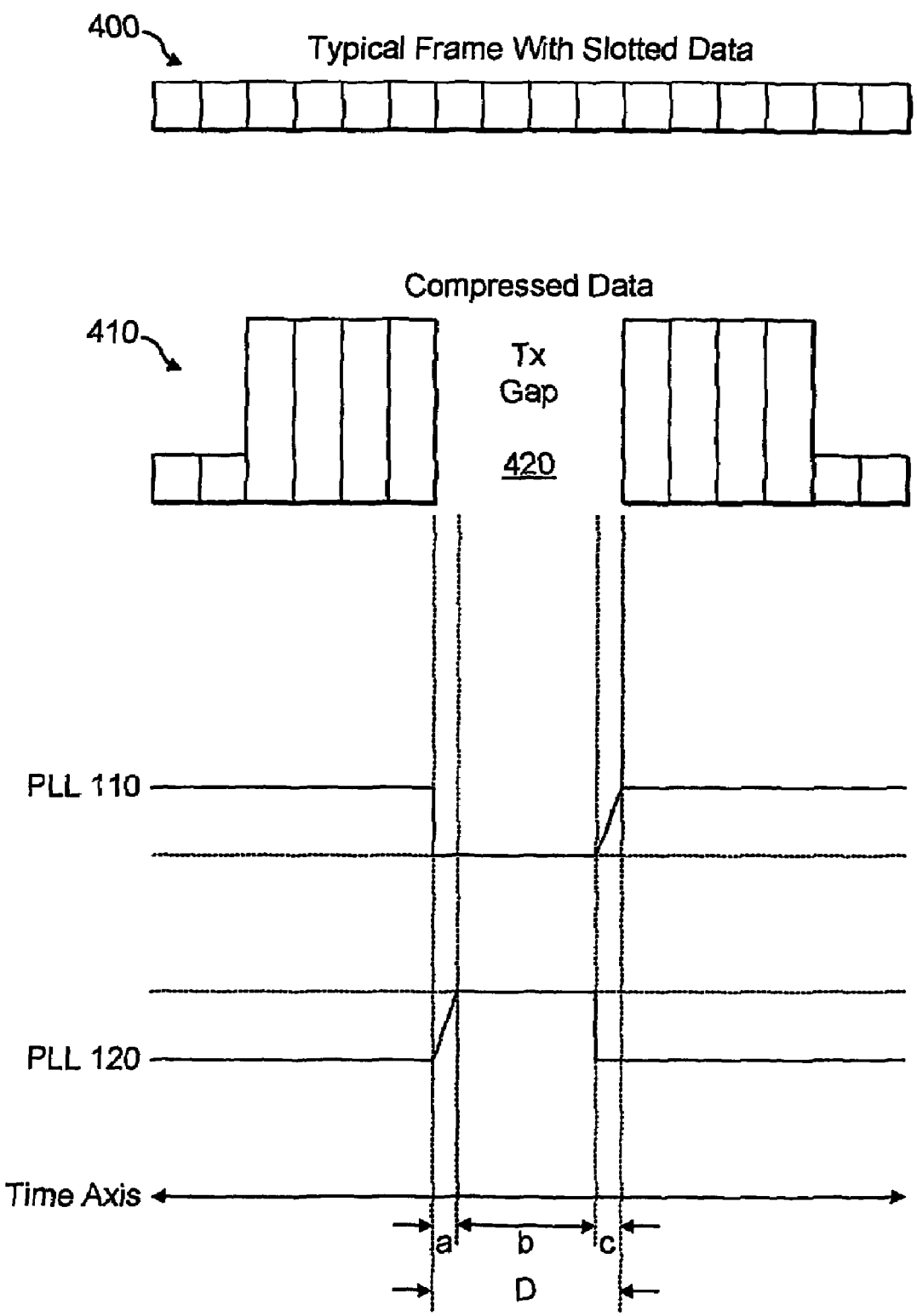

In FIG. 4 of the accompanying drawings there is a time chart which illustrates how a compression technique might be used in a dual standard phone. The drawing also shows how two PLLs 110 and 120 having characteristics similar to those of like PLL 200 might function in a dual standard phone.

Frame 400 represents a typical data frame with slotted data. It is structured without gaps in the transmission of data. Without gaps, a dual standard phone could only communicate with a first system and would not have the opportunity to obtain operational information about the second system.

At the position 410 compressed data is shown. A transmission gap 420 in the data transmission of a dual standard phone using a first system is created. As shown, the power on either side of the gap is increased. For this description the first system is assumed to be GSM. Transmission gap 420 can now be used by the dual standard phone to establish control communication with a second system. For this description the second system is assumed to be WCDMA.

The duration of the transmission gap 420 is time period D. At the beginning of the transmission gap 420 the PLL 110 (see FIG. 1) associated with the GSM system is put in the reduced power mode. At the same time the PLL 120 (see FIG. 1) associated with WCDMA is powered up or taken out of its reduced power mode. For this illustration, the power up time period is assumed to be greater than the power down time period for each of the PLLs. With this assumption the usable portion of the transmission gap (b) is therefore limited by the PLL power up times and not the power down times. The time duration for the PLL 120 to power up is represented by the time period (a). During time duration (b) the second system associated with PLL 120 has the opportunity to establish control communication with the WCDMA system. Time duration (c) is the time required for PLL 110 to re-power up. Therefore minimizing each PLL's power up time, (a) and (c), will maximize the usable portion of the transmission gap 420, (b).

Having thus described the invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof.

The invention claimed is:

1. An apparatus for providing an oscillating signal to a load, the apparatus comprising:
    a phase locked loop (PLL) comprising a feedback loop including a phase detector:
    an attenuator between the load and the feedback loop;
    a power control means for manipulating oscillating signal power;
    an isolator for isolating the feedback loop from the load; and
    a mode selector coupled to the power control means and the isolator for controlling the power control means and the isolator so that in a steady state power mode oscillation power is supplied to the load and the attenuator, and in a reduced power mode power is isolated by the isolator from the load to the feedback loop by bypassing the attenuator so that phase lock is maintained when the oscillation power is reduced.

2. The apparatus of claim 1 wherein the power control means is an energy source.

3. The apparatus of claim 2 wherein the energy source is a DC current sink.

4. The apparatus of claim 1 wherein the power control means is a switchable voltage source.

5. The apparatus of claim 1 wherein the PLL comprises a voltage controlled oscillator (VCO) for generating the oscillating signal, the power control means being disposed within the VCO so that control of the power control means by the mode selector manipulates the power output of the VCO.

6. The apparatus of claim 5 wherein the VCO is a grounded emitter circuit.

7. The apparatus of claim 5 wherein the PLL further comprises:
    a phase detector having an input and an output;
    a VCO having an input and an output, the VCO output being connected to the phase detector input, and the VCO input being connected to the phase detector output for supplying a control signal back to the VCO for controlling the oscillation rate of the VCO; and
    an attenuator coupled to the load and to the phase detector input, the attenuator being operable in the steady state power mode so that a fraction of the power supplied to the load is supplied to the phase detector such that phase lock is maintained.

8. The apparatus of claim 7 further comprising:
    a reference oscillator connected to the phase detector for providing a reference oscillation;
        a divider having an input and an output, the divider input coupled to the output of the VCO and to the attenuator, the divider output coupled to the input of the phase detector, the divider ratio is the multiplier for the reference oscillator;
        and a loop filter connected between the phase detector output and the VCO input for filtering the control signal.

9. The apparatus of claim 1 wherein the isolator is a switch.

10. The apparatus of claim 1 wherein the isolator is a PIN diode arrangement.

11. The apparatus of claim 1 wherein the isolator is a variable attenuator.

12. The apparatus of claim 1 wherein the mode selector is a control signal from a host processor.

13. A dual standard mobile phone comprising the circuit of claim 12.

14. The dual standard phone of claim 13, operable in accordance with the GSM and WCDMA standard.

15. A method of operating a phase locked loop, PLL, to supply an oscillating signal to a load, the PLL comprising:
    a feedback loop including a phase detector:
    an attenuator between the load and the feedback loop;
    a power control means for manipulating oscillating signal power;
    an isolator for isolating the feedback loop from the load; and
    a mode selector coupled to the power control means and the isolator, wherein, the method of operating such a PLL comprises:
    controlling the power control means and the isolator so that in a steady state power mode oscillation power is supplied to the load and the attenuator, and in a reduced power mode power is isolated by the isolator from the load to the feedback loop by bypassing the attenuator so that phase lock is maintained when the oscillation power is reduced.

16. The method of claim 15 further comprising:
controlling the power control means so that output power from the VCO is high; and
controlling the isolator so that output power is supplied to the load, the attenuator divides out a portion of the VCO output power sufficient to maintain phase lock and provides the portion to the feedback loop.

17. A phase locked loop, PLL, to supply an oscillating signal to a load, the PLL comprising:
a;
a feedback loop including a phase detector;
an attenuator between the load and the feedback loop;
a power control means for manipulating oscillating signal power;
an isolator for isolating the feedback loop from the load; and
a mode selector coupled to the power control means and the isolator,
means for controlling the power control means and the isolator so that in a steady state power mode oscillation power is supplied to the load and the attenuator, and in a reduced power mode power is isolated by the isolator from the load to the feedback loop by bypassing the attenuator so that phase lock is maintained when the oscillation power is reduced.

* * * * *